United States Patent [19]
Shimoda

[11] Patent Number: 5,406,427
[45] Date of Patent: Apr. 11, 1995

[54] CLOCK GENERATOR FOR MAGNETIC DISK DRIVE THAT SWITCHES BETWEEN PREAMBLE AND DATA PORTIONS

[75] Inventor: Kaneyasu Shimoda, Kawasaki, Japan

[73] Assignee: Fujitsu Limited, Kawasaki, Japan

[21] Appl. No.: 115,043

[22] Filed: Sep. 1, 1993

[30] Foreign Application Priority Data

Sep. 1, 1992 [JP] Japan .................................. 4-233686

[51] Int. Cl.$^6$ ........................ G11B 5/09; G11B 15/12
[52] U.S. Cl. ...................................... 360/51; 360/61
[58] Field of Search ................ 360/46, 51, 61, 27; 375/18, 101, 118; 364/602

[56] References Cited

U.S. PATENT DOCUMENTS

| | | | |
|---|---|---|---|
| 3,660,821 | 5/1972 | Weber et al. | 360/48 |
| 3,883,891 | 5/1975 | Thompson et al. | 360/47 |
| 4,032,762 | 6/1977 | Caloyannides | 235/152 |
| 4,231,071 | 10/1980 | Anderson | 360/51 |
| 4,890,299 | 12/1989 | Dolivo et al. | 375/18 |
| 4,894,734 | 1/1990 | Fischler et al. | 360/51 |
| 5,036,408 | 7/1991 | Leis et al. | 360/48 |
| 5,258,933 | 11/1993 | Johnson et al. | 364/602 |
| 5,274,509 | 12/1993 | Buch | 360/51 |

OTHER PUBLICATIONS

F. M. Gardner, "Hangup in Phase-Lock Loops", IEEE Transactions on Communications, vol. COM-25, No. 10, pp. 1210-1214 Oct. 1977.
Kurt H. Mueller & Markus Müller, "Timing Recovery in Digital Synchronous Data Receivers", IEEE Transactions on Communications, vol. COM-24, No. 5, pp. 516-531 May 1976.

*Primary Examiner*—Donald Hajec
*Assistant Examiner*—Won Tue C. Kim
*Attorney, Agent, or Firm*—Armstrong, Westerman, Hattori, McLeland & Naughton

[57] ABSTRACT

In a clock generator for magnetic disk drive of the zone-bit recording type in which a training signal is written in a preamble portion of data, comprising: a sample-holder circuit for generating a sampling signal from a read signal; a phase-comparator for detecting a phase difference from the sampling signal; a loop filter; and a voltage-controlled oscillator whose frequency is controlled by the phase difference as it is smoothed; there is provided a frequency divider; a clock extraction circuit for extracting a clock timing from the training signal as it is equalized partially-response signal; and a phase-comparator for finding a phase difference from an output of the frequency divider and an output of the clock extraction circuit, and the phase-comparator is connected to the loop filter during reproduction of the preamble portion of the data and the phase-comparator is connected to the loop filter during reproduction of a data portion of the data by the switching of a change-over switch. As a result, hangup is prevented and an accurate clock timing in the clock generator.

5 Claims, 12 Drawing Sheets

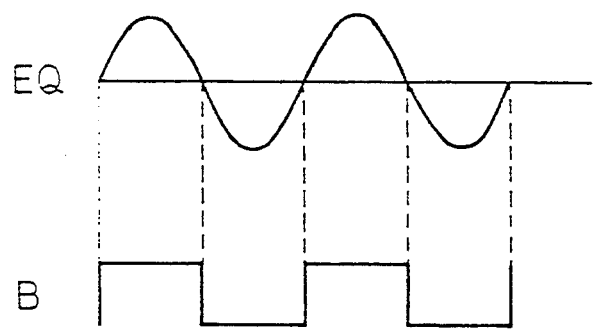
Fig.6A EQ
Fig.6B B
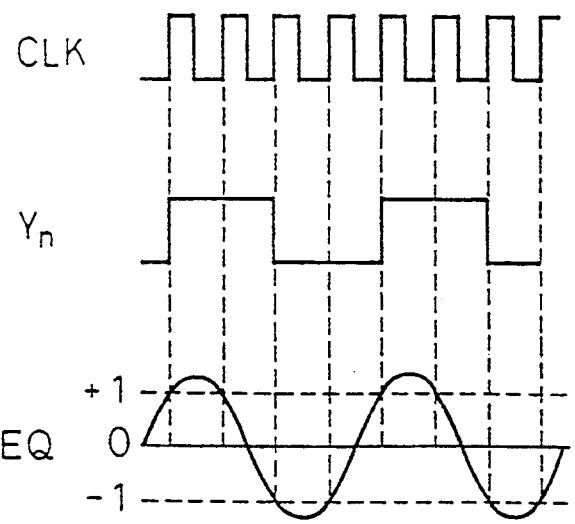
Fig.7A CLK
Fig.7B $Y_n$
Fig.7C EQ

Fig.13A  H  
Fig.13B  EQ  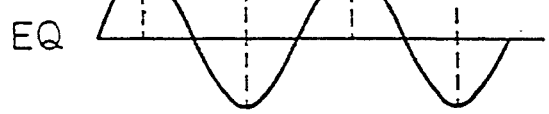

CLOCK GENERATOR FOR MAGNETIC DISK DRIVE THAT SWITCHES BETWEEN PREAMBLE AND DATA PORTIONS

BACKGROUND OF THE INVENTION

1. Field of the Invention

The present invention relates to a clock generator for a magnetic disk drive, and more particularly, to a clock generator which is used in a zone-bit-recording type magnetic disk drive and which prevents failure (false) lock (i.e., hangup in phase-lock loops).

2. Description of the Related Art

In the field of magnetic disk drives, recent years have seen increase in the recording density aimed at a reduction in the device size and an increase in the recording capacity, resulting in more intersymbol interference of a read signal. To deal with this, over the past few years, magnetic disks of a partial-response type utilizing intersymbol interference have been brought into practical use. In a partial-response type magnetic disk drive, if a determination point (i.e., sampling point) differs from a signal point of a read signal waveform (i.e., time at which an eye of an eye-pattern opens widest), the error rate increasingly deteriorates. Hence, in order to suppress a timing difference between the signal point and the determination point as much as possible, a clock is reproduced directly from a sampling read signal. The reliability of a clock generator of the magnetic disk drive in recovering the clock timing therefore needs to be improved.

FIG. 1 shows a structure of a clock generator 60 of a conventional magnetic disk drive. A read signal read by a head H from a magnetic disk D in which data are recorded is amplified by an amplifier AP and partially equalized by a partial-response equalizing circuit PE to become an equalized read signal EQ which will be given to a sample-holder circuit 61.

The sample-holder circuit 61 generates a sampling signal Yn from the partially equalized read signal EQ. The sampling signal Yn is given to a partial-response phase-comparison circuit 90 and a data detection part 70. The partial-response phase-comparison circuit 90 comprises a ternary detection circuit 62, a sample-holder circuit 63, a flip-flop 64, multipliers 65 and 66, and a subtracter 67. The sampling signal Yn is supplied to the sample-holder circuit 63 which serves as means for delaying the sampling signal Yn and also to the ternary detection circuit 62.

The ternary detection circuit 62 detects three magnitude values in the sampling signal Yn, i.e., +1, 0 and −1, and generates a detection signal Xn which will be given to the first multiplier 65 and to the flip-flop 64 which serves as means for delaying the detection signal Xn. The sample-holder circuit 63 holds the sampling signal Yn received therein until receipt of a sampling clock so as to generate a delayed sampling signal Yn-1 which is delayed in time by 1 symbol. The flip-flop 64 holds the detection signal Xn received therein until receipt of the same sampling clock signal to thereby generate a delayed detection signal Xn-1 which is delayed in time by 1 symbol.

The delayed sampling signal Yn-1 and the detection signal Xn are fed to the first multiplier 65 where they are multiplied while the sampling signal Yn and the delayed detection signal Xn-1 are given to the second multiplier 66 where they are multiplied. Products calculated at the first and the second multipliers 65 and 66 are given to the subtracter 67 which then calculates the difference between the products given thereto, then the difference is multiplied to thereby detect a phase difference Zn between the sampling clock pulse and the real signal point of the read signal waveform. The phase difference Zn is expressed by the equation below which is described in the literature titled "Timing recovery in digital synchronous receivers" (IEEE TRANSACTION COMMUNICATIONS, VOL. COM-24, No. 5, May 19, p.516–p.531):

$$Zn = -(Yn\text{-}1 * Xn) + (Yn * Xn\text{-}1) \tag{1}$$

The phase difference Zn is smoothed by a loop filter 68. The phase difference Zn thus smoothed controls the frequency of a voltage-controlled oscillator 69 and the voltage-controlled oscillator 69 outputs a clock signal. The sampling clock timing obtained in this manner is fed back to the sample-holder circuits 61 and 63, the flip-flop 64 and the data detection part 70. Sampling by the sample-holder circuits 61 and 63 and resetting of data by the flip-flop 64 are performed under the control of the same clock timing. At the same time, this clock is given to the data detection part 70 which reproduces data from the sampling signal Yn (e.g., a data detection part for detection data by maximum likelihood detection) and used for reproduction of data.

To increase the speed of recovering this clock timing, in an preamble portion of the data, the following repetition sequences $$+1, +1, -1, -1, +1, +1, -1, -1 \ldots$$

is written as a training signal and the clock is reproduced at acquisition for clock recovery from the preamble portion as is customarily done. Besides, the data are recorded on the disk D by the zone-bit recording method to enhance the recording density of the data on the disk.

FIG. 2A is a view showing distribution of recording units U in a recording track Tin of an inner periphery of the disk D and a recording track Tout of an outer periphery of the disk D within the conventional zone-bit recording type magnetic disk drive. In the zone-bit recording method, as shown in FIG. 2A, the density of magnetic recording is entirely constant from the inner recording track Tin to the outer recording track Tout and therefore the outer recording track Tout includes the greatest number of the recording units U.

FIG. 2B shows the format of recorded data in each recording unit U of FIG. 2A. Each recording unit U includes a preamble portion in which the training signal is written and a data portion in which the data are recorded.

FIG. 3A is a waveform diagram showing the waveform of the training signal written in the preamble portions of FIG. 2B as it is read at the outer track Tout while FIG. 3B is a waveform diagram showing the waveform of the training signal written in the preamble portions of FIG. 2B as it is read at the inner track Tin. For example, in a case where the number of the recording units U of the outer track Tout is double that of the inner track Tin in FIG. 2A, the frequency of the waveform of the training signal read at the outer track Tout is double that of the training signal read at the inner track Tin.

Assume in FIGS. 3A and 3B that the points indicated at ● are normal signal points at which the clock signal is hungup and the points indicated at □ are signal points at which the clock generator is hungup as shown in FIG. 3C, at the outer track Tout, the normal frequency is 4f1 and the hangup frequency is 2f1 while at the inner track Tin, the normal frequency is 2f1 and the hangup frequency is f1.

However, in the conventional clock generator of the conventional zone-bit recording type magnetic disk drive, as shown in FIG. 3C, the hangup frequency 2f1 at the outer track Tout is equal to the hangup frequency 2f1 at the inner track Tin. Hence, during acquisition for clock recovery using the read signal in preamble portions of the outer track Tout, hangup occurs at the point at which the frequency is 2f1, in which case normal clock recovery becomes impossible.

The reason why this hangup occurs is because in conventional Equation 1 for detection of the phase difference Zn, even though the sampled read signals Yn and Yn-1 are both at the level ±1, the phase difference Zn appears to be eliminated.

In an effort to solve this problem, the inventor of the present invention has paid attention to a fact that in a zone-bit-recording type magnetic disk drive, the read signal waveform of the training signal which is recorded in the preamble portion of the data is a sinusoidal waveform. The inventor of the present invention has found that the clock signal can be extracted as a continuous signal having an analog waveform without performing sampling from the read signal waveform of the training signal, thus arriving at the present invention.

SUMMARY OF THE INVENTION

The object of the present invention is to provide a clock generator of a magnetic disk drive in which the problem in the conventional clock generator of the conventional magnetic disk drive is absent. In the clock generator of the magnetic disk drive according to the present invention, hangup would not occur and therefore accurate clock reproduction is performed since after synchronizing a PLL (phase lock loop) system which is comprised of a loop filter and a voltage-controlled oscillator with a hangup frequency using a clock component which is extracted from a training signal which is read from a preamble portion of data, the loop is switched to hangup by means of a sampled read signal Yn.

According to the present invention, there is provided a clock generator for the magnetic disk drive in which data are recorded by the zone-bit recording method, a read signal read from a magnetic disk in which a training signal is recorded in a preamble portion of the data is sampled after partial equalizing to thereby generate a sampling read signal from which data and a clock are reproduced, the clock generator comprising: a sample-holder circuit for generating a sampling signal from a read signal; a partial-response phase-comparator comprising: a ternary detection circuit for detecting three magnitude values +1, 0 and −1 of the sampling signal to thereby generate a detection signal; first delay means for generating a delayed sampling signal which is delayed in time by 1 symbol from the sampling signal; second delay means for generating a delayed sampling signal which is delayed in time by 1 symbol from the detection signal Xn; a first multiplier for multiplying the delayed sampling signal and the detection signal; a second multiplier for multiplying the sampling signal and the delayed sampling signal; and a subtracter for calculating the difference between the products which are obtained in the first and the second multipliers and for detecting a phase difference between a clock and a signal point of a read signal waveform; a loop filter for smoothing the phase difference signal which is detected; a voltage-controlled oscillator the frequency of which is controlled by the phase difference which is smoothed; a frequency divider for frequency dividing a signal output of the voltage-controlled oscillator; a clock extraction circuit for extracting a clock component from the training signal as it is partially equalized; a phase-comparator for comparing the phase of an output signal of the frequency divider with the phase of an output signal of the clock extraction circuit to thereby obtain a phase difference; and a change-over switch which is disposed between the partial-response phase-comparator, the phase-comparator and the loop filter, the change-over switch connecting the phase-comparator to the loop filter during reproduction of the preamble portion of the data and for connecting the partial-response phase-comparator to the loop filter during reproduction of a data portion of the data.

In the clock-generator of the magnetic disk drive according to the present invention, the clock component is extracted from the training signal which is reproduced from the preamble portion of the data of the disk and which becomes a sinusoidal waveform which is ¼ of the frequency of the clock frequency after partial equalization, and the phase of this clock component is compared with the phase of the clock which is obtained by frequency dividing the output signal of the voltage-controlled oscillator to thereby find the phase difference between the two. During reproduction of the preamble portion of the data, the phase difference thus obtained is smoothed by the loop filter and used to control the frequency of the voltage-controlled oscillator and synchronizing with a normal clock frequency is therefore performed. This frequency is different from the hangup frequency. Hence, even when a clock synchronous system is switched to the partial-response phase-comparator after detection of the preamble portion of the data, normal recovery can be continuously performed. As a result, a possibility that a clock will be generated by a hangup signal is eliminated.

BRIEF DESCRIPTION OF THE DRAWINGS

The present invention will be more clearly understood from the description as set forth below with reference to the accompanying drawings, wherein:

FIGS. 6A and 6B are waveform diagrams showing operation waveforms of the respective parts shown in FIG. 5;

FIGS. 7A to 7C are waveform diagrams showing operation waveforms of the respective parts shown in FIG. 5;

FIGS. 13A and 13B are waveform diagrams showing operation waveforms of predetermined parts shown in FIG 12.

DESCRIPTION OF THE PREFERRED EMBODIMENTS

A preferred embodiment according to the present invention will be explained hereinafter with reference to the attached drawings.

Figure 4:
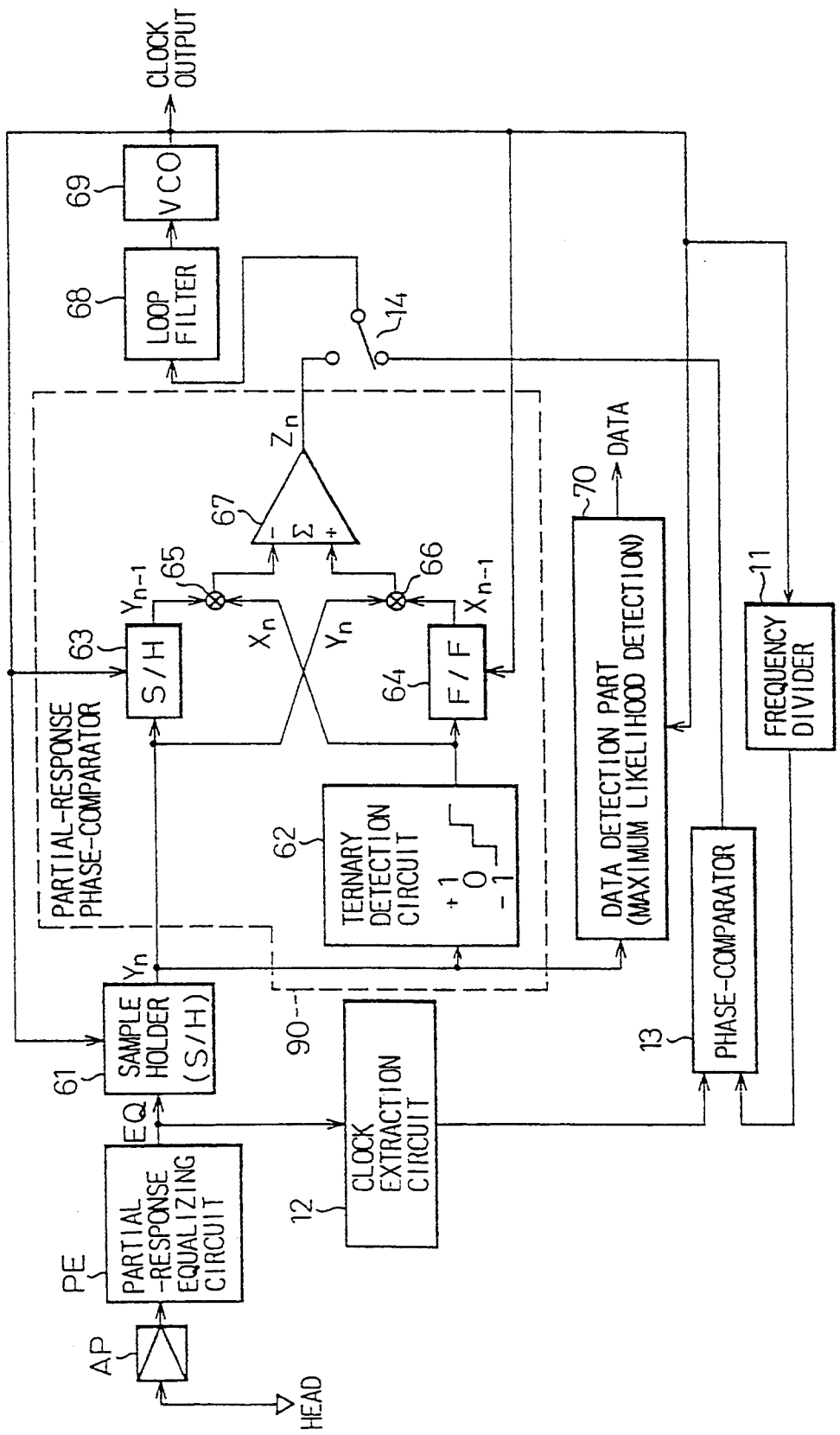
FIG. 4 is a view showing the fundamental structure of the clock generator of the magnetic disk drive according to the present invention.

FIG. 4 is a block diagram showing the fundamental structure of the clock generator of a magnetic disk drive according to the present invention.

Figure 1:
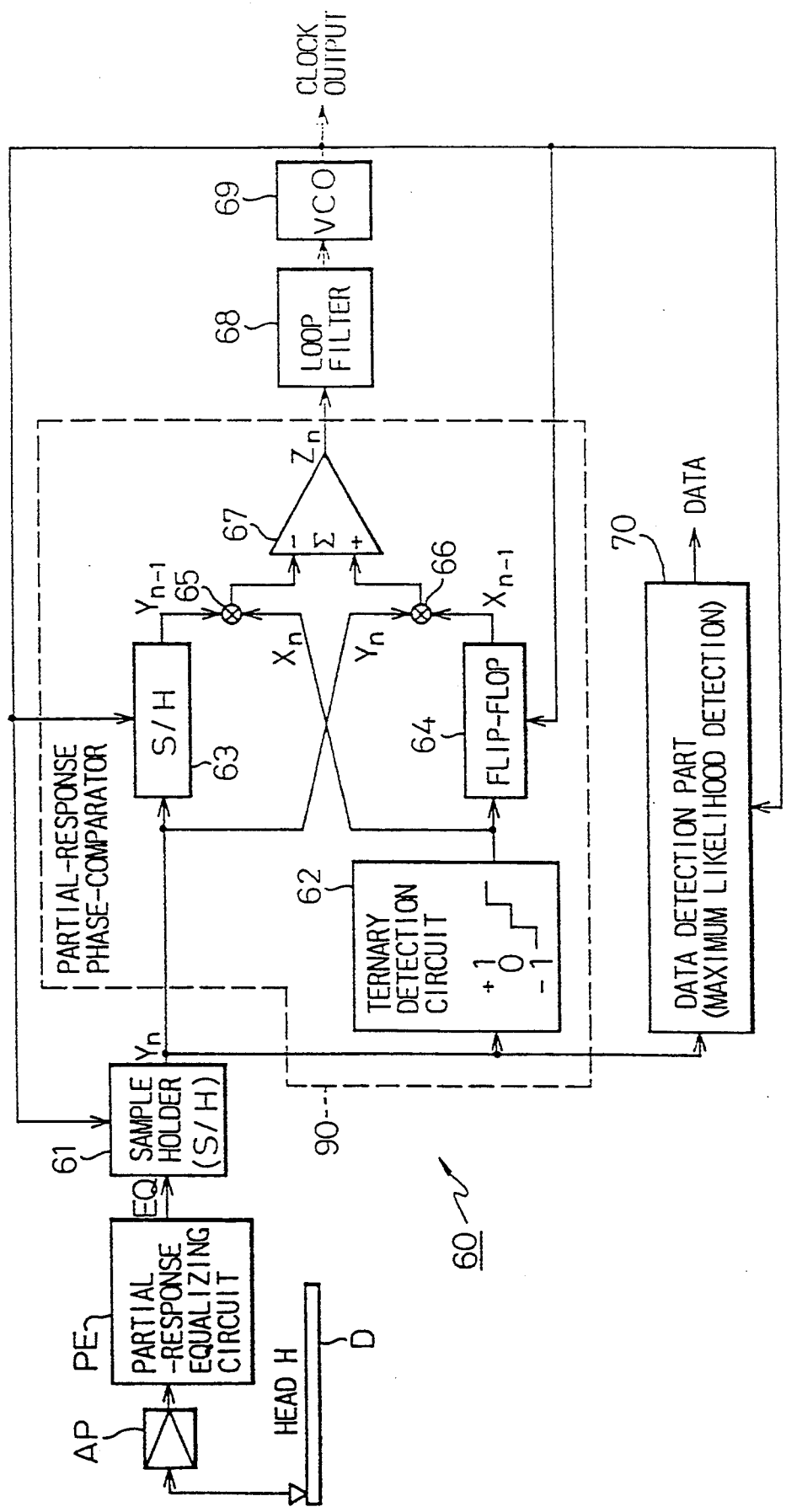
FIG. 1 is a block circuit diagram showing an example of the structure of the conventional clock generator of the magnetic disk drive.

In FIG. 4, the elements that have the same functions as elements in FIG. 1 are assigned the same reference numerals.

In the magnetic disk drive according to the present invention, data are recorded by the zone-bit recording method; a read signal read from a magnetic disk in which a training signal is recorded in a preamble portion of the data is sampled after partial equalizing; and data and a clock are reproduced from the sampled read signal.

A clock generator for the magnetic disk drive according to the present invention has following elements which are the same as the conventional clock generator of the magnetic disk drive: a sample-holder circuit 61; a partial-response phase-comparator 90 having a ternary detection circuit 62, a sample-holder circuit 63, a flip-flop 64, multipliers 65 and 66, and a subtracter 67; a loop filter 68; a voltage-controlled oscillator 69; a data detection part 70. In addition to the above-described elements, a frequency divider 11, a clock extraction circuit 12, a phase-comparator 13 and a change-over switch 14 are newly provided in the clock generator for the magnetic disk drive according to the present invention.

The sample-holder circuit 61 generates a sampling signal Yn from the read signal. The ternary detection circuit 62 detects three magnitude values +1, 0 and −1 of the sampling signal Yn and generates a detection signal Xn. The sample-holder circuit 63 generates a delayed sampling signal Yn-1 which is delayed in time by 1 symbol from the sampling signal Yn. The flip-flop 64 generates a delayed sampling signal Xn-1 which is delayed in time by 1 symbol from the detection signal Xn. The multiplier 65 multiplies the delayed sampling signal Yn-1 and the detection signal Xn, and the multiplier 66 multiplies the sampling signal Yn and the delayed sampling signal Xn-1. The subtracter 67 calculates the difference between the products obtained from the multipliers 65 and 66 and detects a phase difference Zn between a clock and a signal point of a read signal waveform. The loop filter 68 smoothes the detected phase difference Zn. The frequency of the voltage-controlled oscillator 69 is controlled by the smoothed phase difference Zn.

The frequency divider 11 divides the signal from the voltage-controlled oscillator 69 and supplies the same to the phase-comparator 13. The phase-comparator 13 compares the phase of an output signal of the frequency divider 11 with the phase of an output signal of the clock extraction circuit 12 to obtain a phase difference. The change-over switch 14 is disposed between the partial-response phase-comparator 90, the phase-comparator 13 and the loop filter 68, and connects the phase-comparator 13 to the loop filter 68 during reproduction of the preamble portion of the data and connects the partial-response phase-comparator 90 to the loop filter 68 during reproduction of a data portion of the data.

The function of the clock generator for the magnetic disk drive according to the present invention will be explained hereinafter according to the concrete embodiment of the clock extraction circuit 12.

Figure 5:
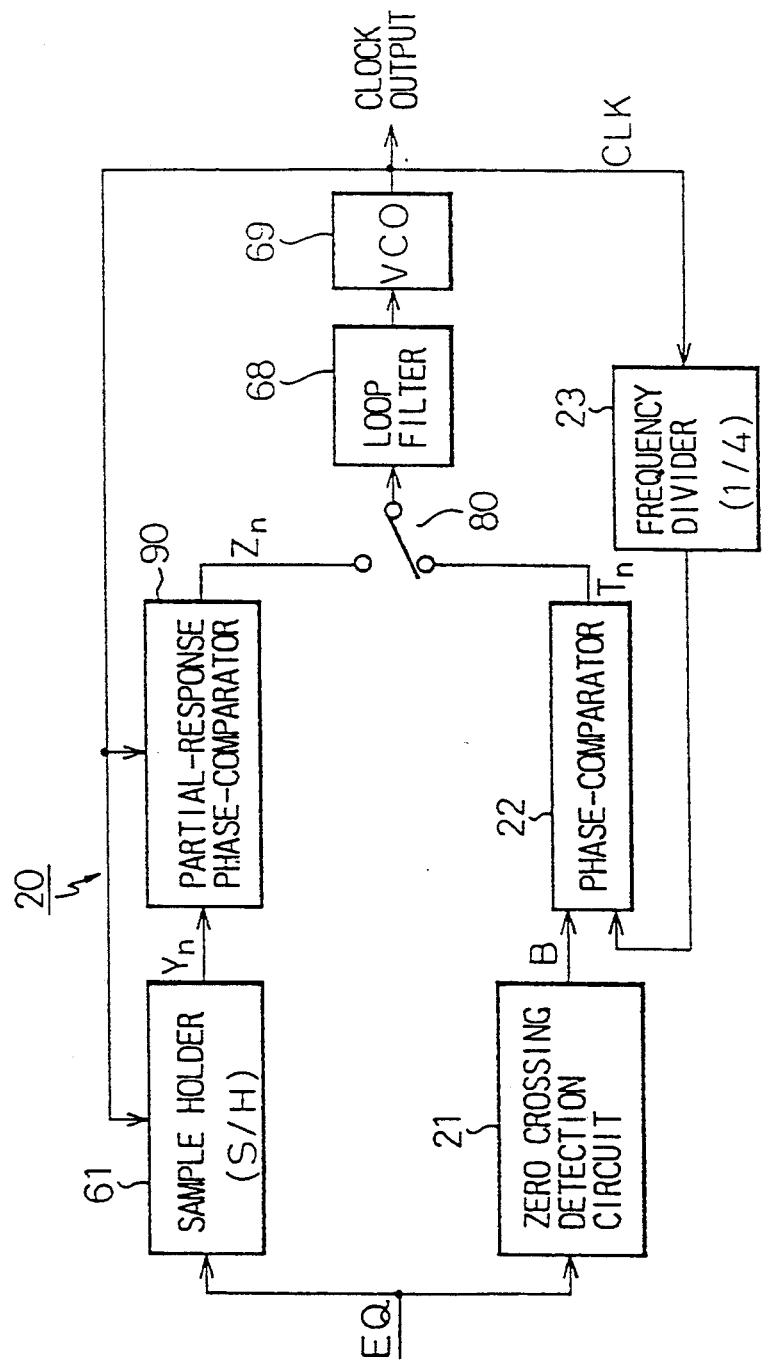
FIG. 5 is a block circuit diagram showing the structure of the first embodiment of the present invention.

FIG. 5 is a block circuit diagram showing the structure of a clock generator 20 of a zone-bit recording type magnetic disk drive according to a first embodiment of the present invention, and shows the structure beyond the partial-response equalizing circuit PE of the clock generator 60 of the conventional magnetic disk drive described with reference to FIG. 1.

The data detection part 70 is omitted. Parts similar to those previously described with reference to FIG. 1 showing the clock generator 60 of the conventional magnetic disk drive are denoted by the same reference numerals, and similar descriptions will simply be omitted.

In the first embodiment as well, the equalized read signal EQ generated by partial equalization at the partial equalizing circuit PE is supplied to the sample-holder circuit 61 where the sampling signal Yn is generated. The read signal EQ, or the training signal partially equalized by the partial equalizing circuit PE, has a sinusoidal waveform which is ¼ of the frequency of the clock CLK as shown in FIGS. 6A, 6B, 7A, 7B, and 7C. On the other hand, the sampling signal Yn generated by the sample-holder circuit 61 has a rectangular waveform.

The sampling signal Yn is given to a partial-response phase-comparator 90 which comprises the sample 63, the flip-flop 64, the multipliers 65 and 66, and the subtracter 67 as shown in FIG. 6. Likewise in the conventional magnetic disk drive, in the partial-response phase-comparator 90, three magnitude values of the sampling signal Yn, i.e., +1, 0 and −1 are detected so that the detection signal Xn is created, the delayed sampling signal Yn-1 which is delayed in time by 1 symbol is generated from the sampling signal Yn by the sample-holder circuit 63, and the delayed detection signal Xn-1 which is delayed in time by 1 symbol is generated from the detection signal Xn by the flip-flop 64. Following this, the delayed sampling signal Yn-1 and the detection signal Xn are multiplied while the sampling signal Yn and the delayed detection signal Xn-1 are multiplied respectively in the multipliers 65 and 66. The products thus calculated are supplied to the subtracter 67 so that phase difference Zn between the clock and the signal point of the read signal waveform is detected as in the conventional magnetic disk drive.

On the other hand, the equalized read signal EQ generated by partial equalization at the partial equalizing circuit PE (not shown) is also supplied to a zero crossing detection circuit 21 which is disposed parallel to the sample-holder circuit 61 as a clock extraction circuit. The zero crossing detection circuit 21 extracts timings at which the training signal crosses the level 0 and generates a rectangular waveform indicated at B which will be then sent to a phase-comparator 22, as shown in FIG. 6B.

As described earlier, since the equalized read signal EQ obtained from the training signal is a sinusoidal waveform which is ¼ of the frequency of the clock CLK, in this embodiment, the clock output CLK from the voltage-controlled oscillator 69 which will be described later is frequency divided by four by a quarter frequency divider 23 and sent to the phase-comparator 22. The phase-comparator 22 compares the phase of the clock which is generated by extracting the timing at which the training signal crosses the level 0 with the phase of the clock which is created by frequency dividing the output signal of the voltage-controlled oscillator 69 by four, and outputs a phase difference Tn.

The phase difference Zn from the partial-response phase-comparator 90 and the phase difference Tn from the phase-comparator 22 are respectively given to two input terminals of a change-over switch 80 in such a manner that either one output will be received by the loop filter 68. In this embodiment, the change-over switch 80 connects the loop filter 68 to the phase-comparator 22 during reproduction of the preamble portion of data and connects the loop filter 68 to the partial-response phase-comparator 90 during reproduction of the data portion of the data.

Hence, during reproduction of the preamble portion of data, the phase difference Tn between the clock which is generated by extracting the timings at which the training signal crosses the level 0 and the clock which is created by frequency dividing the output signal of the voltage-controlled oscillator 69 by four is sent from the phase-comparator 22 to the loop filter 68 through the change-over switch 80 so that the frequency of the voltage-controlled oscillator 69 is synchronized with the normal frequency. At this stage, the frequency of the voltage-controlled oscillator 69 is clearly different from the hangup frequency by the sampling signal. Hence, even when the change-over switch 80 has changed its connection to the partial-response phase-comparator 90 and the clock generation system has changed to hangup by means of the sampling signal during reproduction of the data portion that follows, normal hangup continues.

Figure 8:
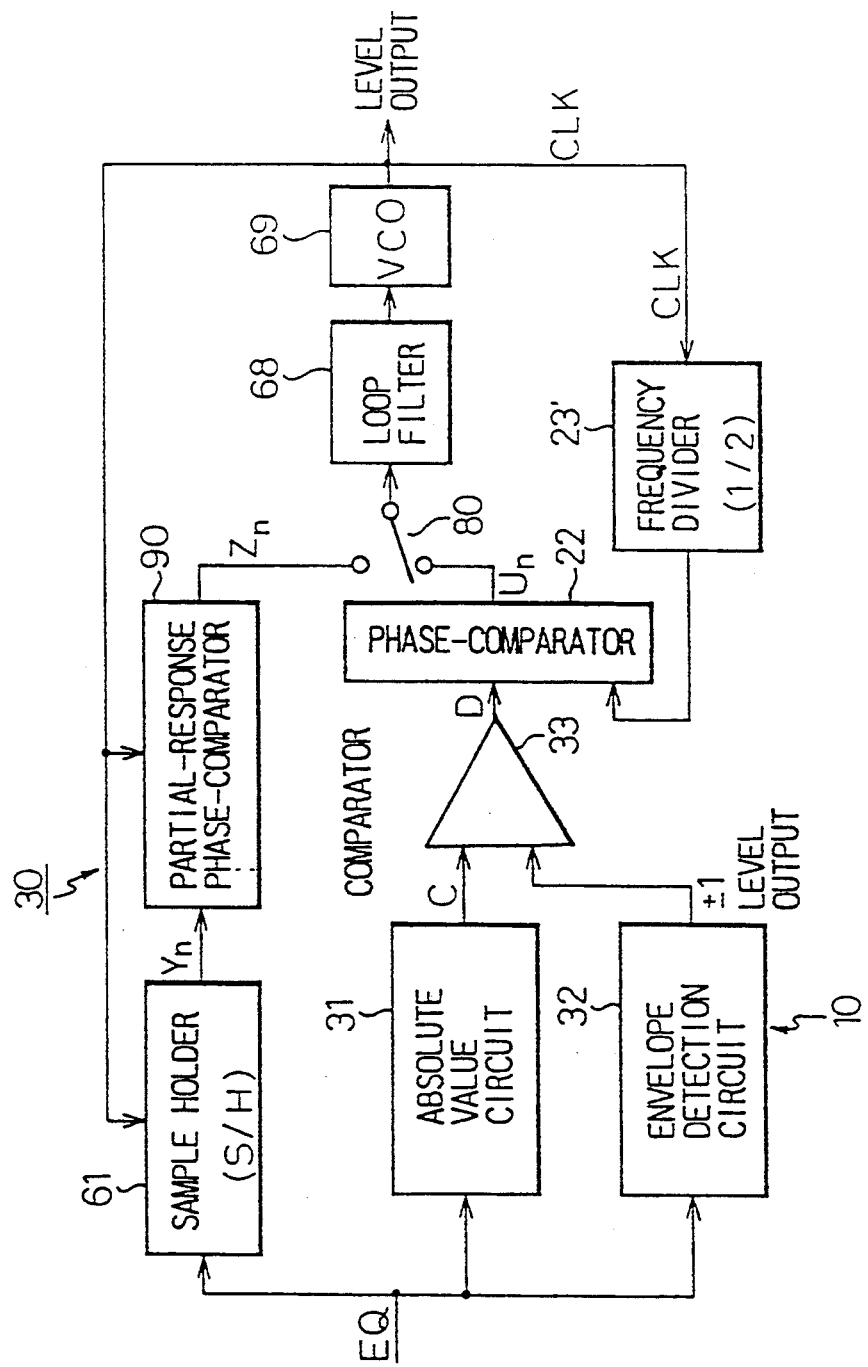
FIG. 8 is a block circuit diagram showing the structure of the clock generator according to the second embodiment of the present invention.

FIG. 8 is a block circuitry diagram showing a structure of a clock generator 30 of a zone-bit-recording-type magnetic disk drive according to a second embodiment of the present invention. The only difference from the clock generator 20 of the magnetic disk drive according to the first embodiment described with reference to FIG. 5 is the structure of a clock extraction circuit 12. Parts similar to those previously described with reference to FIG. 1 showing the clock generator 20 of the conventional magnetic disk drive of the first embodiment described with reference to FIG. 5 are denoted by the same reference numerals, and similar description will be simply be omitted.

In the second embodiment, the clock extraction circuit 12 is comprised of an absolute value circuit 31, an envelope detect circuit 32 and a comparator 33. An output of the comparator 33 is given to the phase-comparator 22 which receives at its other input an output of a frequency divider 23'.

In the second embodiment as well, the equalized read signal EQ which is generated by partially equalizing the training signal in the partial equalizing circuit PE (not shown) has a sinusoidal waveform which is ¼ of the frequency of the clock CLK as shown in FIGS. 6A, 6B, 7A, 7B, and 7C. On the other hand, the sampling signal Yn, which is created by the sample-holder circuit 61, has a rectangular waveform.

The partially equalized read signal EQ is also given to the absolute value circuit 31 and the envelope detection circuit 32 which are disposed parallel to the sample-holder circuit 61. At the absolute value circuit 31, as shown in FIG. 8, negative portions of the training signal are inverted so that a rectifying wave as indicated at C is created which will be supplied to the comparator 33. Since the equalized read signal EQ, i.e., the training signal as it is partially equalized, is a sinusoidal waveform, the envelope detection circuit 32 detects the levels ±1 as an envelope which will be then fed to the comparator 33.

Figure 9:
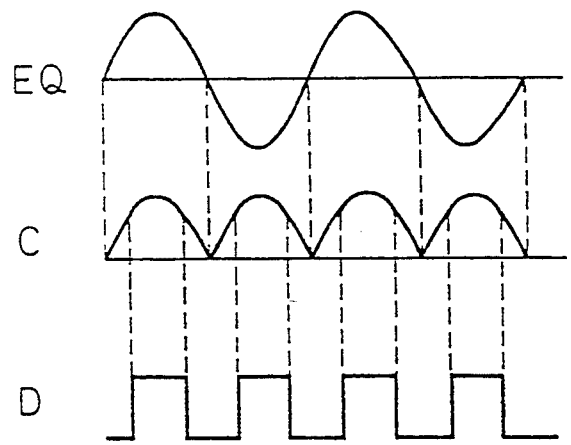
FIGS. 9A to 9C are waveform diagrams showing operation waveforms of predetermined parts shown in FIG. 8.

The comparator 33 compares the signal received from the absolute value circuit 31 with the levels ±1 so that a rectangular wave similar to that indicated at D in FIG. 9C is developed and inputted to the phase-comparator 22. As described earlier, although the equalized read signal EQ of the training signal is a sinusoidal waveform which is ¼ of the frequency of the clock CLK, since the equalized read signal EQ of the training signal is rectified by the absolute value circuit 31, the clock signal extracted from the equalized read signal EQ of the training signal after rectification is ½ of the frequency of the clock CLK. Hence, in this embodiment, the clock output CLK of the voltage-controlled oscillator 69 which will be described later is frequency divided by 2 by a half frequency divider 23' and given to the phase-comparator 22.

The phase-comparator 22 compares the phase of the rectangular which is received from the comparator 33 with the phase of the clock which is created by frequency dividing the output signal of the voltage-controlled oscillator 69 by 2, and outputs a phase difference Un.

The phase difference Zn from the partial-response phase-comparator 90 and the phase difference Un from the phase-comparator 22 are respectively sent to two input terminals of the change-over switch 80 in such a manner that either one output will be received by the loop filter 68. In this embodiment, the change-over switch 80 connects the loop filter 68 to the phase-comparator 22 during reproduction of the preamble portion of data and connects the loop filter 68 to the partial-response phase-comparator 90 during reproduction of the data portion of the data.

Hence, during reproduction of the preamble portion of data, the phase difference Un between the clock which is generated by comparing the envelop of the training signal and the absolute value and the clock which is created by frequency dividing the output signal of the voltage-controlled oscillator 69 by 2 is sent from the phase-comparator 22 to the loop filter 68 through the change-over switch 80 so that the frequency of the voltage-controlled oscillator 69 is synchronized with the normal frequency which is different from the hangup frequency by the sampling signal. Hence, even when the change-over switch 80 has changed its connection to the partial-response phase-comparator 90 and the clock generation system has changed to hangup by means of the sampling signal during reproduction of the data portion that follows, continuation of hangup is ensured.

Figure 2A:
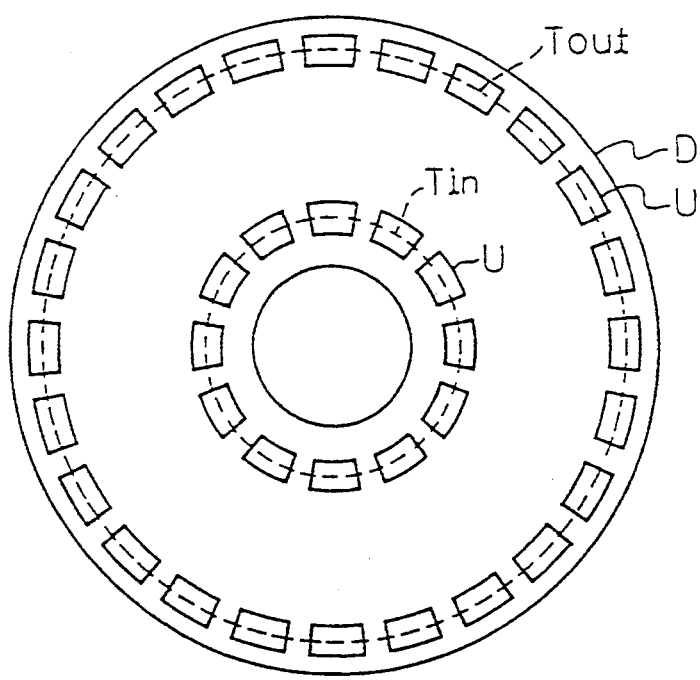
FIG. 2A is an explanatory diagram showing the distribution of the recording units in the recording tracks of the inner and the outer peripheries of the disk of the conventional magnetic disk drive of the zone-bit recording type.
Figure 2B:
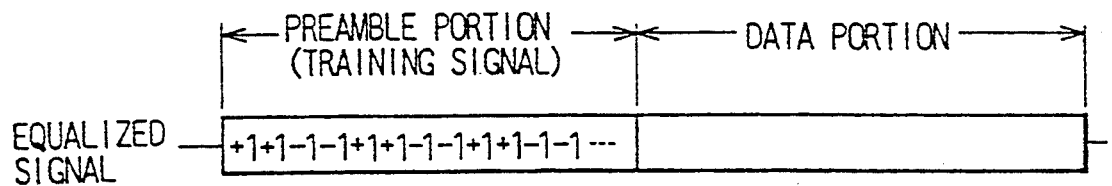
FIG. 2B is an explanatory diagram showing the format of recorded data in each recording unit.
Figure 3A:
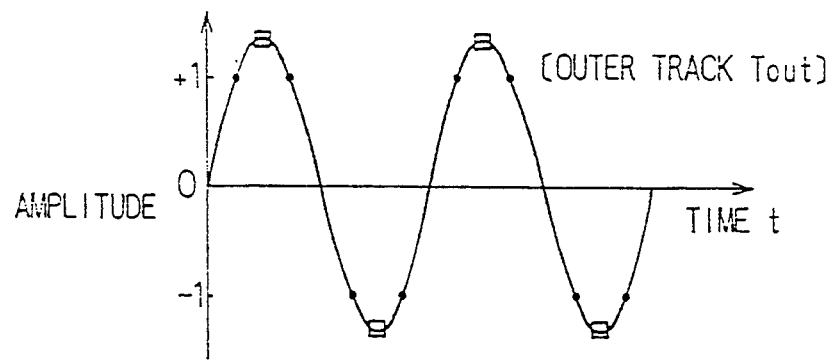
FIG. 3A is a waveform diagram showing the waveform of the training signal written in the preambles as those shown in FIG. 2B as it is read at the outer periphery.
Figure 3B:
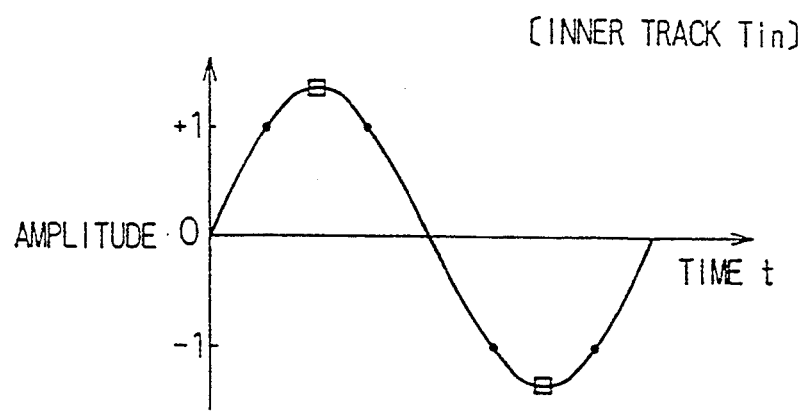
FIG. 3B is a waveform diagram showing the waveform of the training signal written in the preambles as those shown in FIG. 2B as it is read at the inner periphery.
Figure 3C:
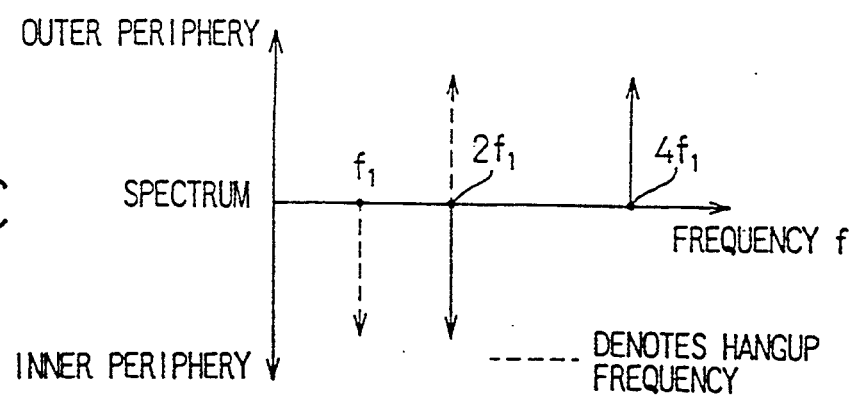
FIG. 3C is a view explaining the relationship between the hangup frequencies by means of the training signal and the hangup frequency.
Figure 10:
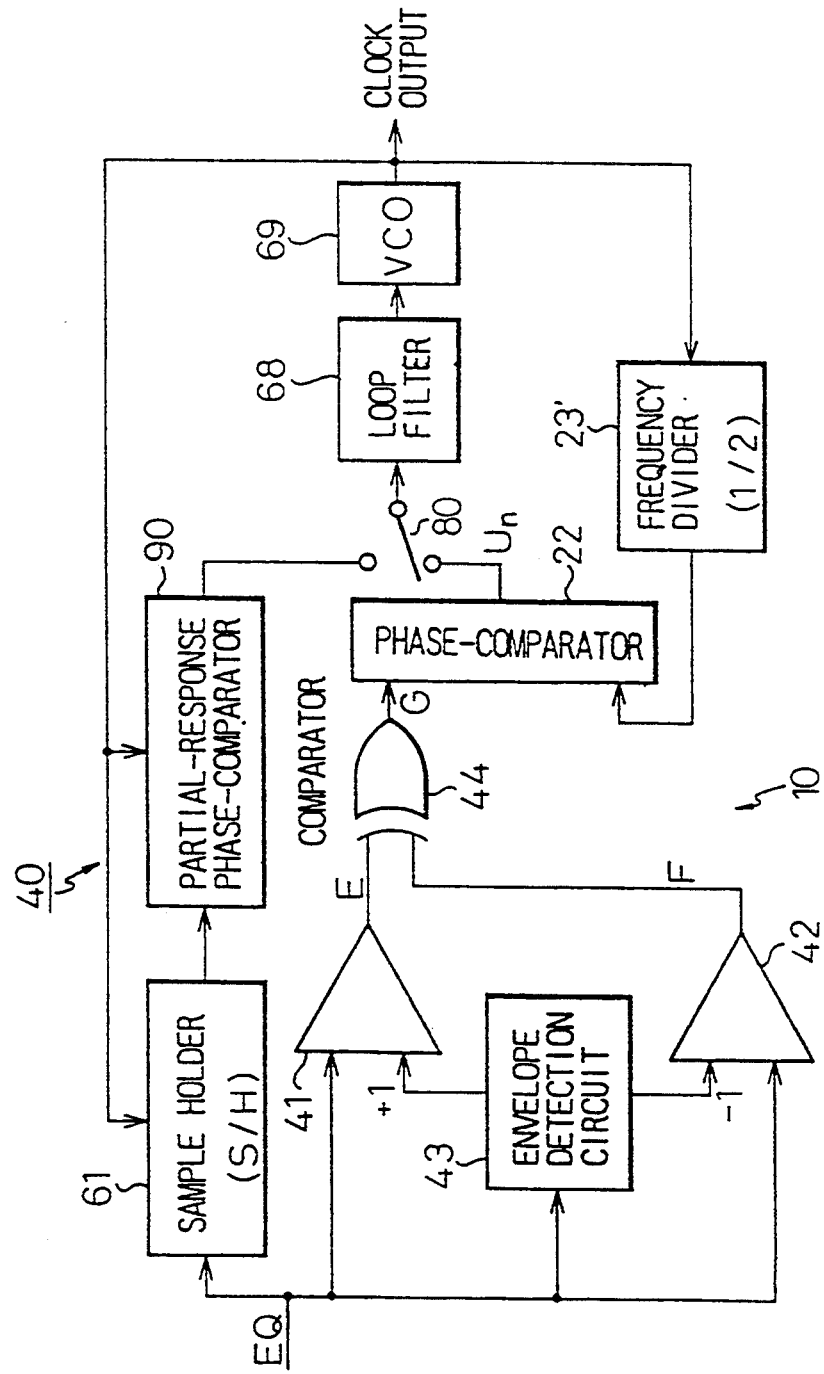
FIG. 10 is a block circuit diagram showing the structure of the clock generator according to the third embodiment of the present invention.

FIG. 10 is a block circuit diagram showing a structure of a clock generator 40 of a zone-bit-recording-type magnetic disk drive according to a third embodiment of the present invention. The only difference from the clock generator 20 of the magnetic disk drive according to the first embodiment described with reference to FIG. 2 is the structure of a clock extraction circuit 12. Parts similar to those previously described with reference to FIG. 1 showing the clock generator 20 of the conventional magnetic disk drive of the first embodiment described with reference to FIG. 5 are denoted by the same reference numerals, and similar descriptions will simply be omitted.

In the third embodiment, the clock extraction circuit 12 is comprised of first and second comparators 41 and 42, an envelope detection circuit 43 and an exclusive OR circuit 44. An output of the exclusive OR circuit 44 is sent to the phase-comparator 22 which receives at its other input an output of the frequency divider 23'.

In the third embodiment, the equalized read signal EQ which is generated by partially equalizing the training signal at the partial-response equalizing circuit PE (not shown) has a sinusoidal waveform which is ¼ of the frequency of the clock CLK as shown in FIGS. 6A, 6B, 7A, 7B, and 7C. On the other hand, the sampling signal Yn which is created by the sample-holder circuit 61 has a rectangular waveform.

The partially equalized read signal EQ is also given to one inputs of the first and the second comparators 41 and 42 and the envelope detection circuit 43 which are disposed parallel to the sample-holder circuit 61. Since the equalized read signal EQ, i.e., the training signal as it is partially equalized, is a sinusoidal waveform, the envelope detection circuit 43 detects the levels ±1 as an envelope. The +1 level is supplied to other input of the first comparator 41 and the −1 level is supplied to other input of the second comparator.

Figure 11:
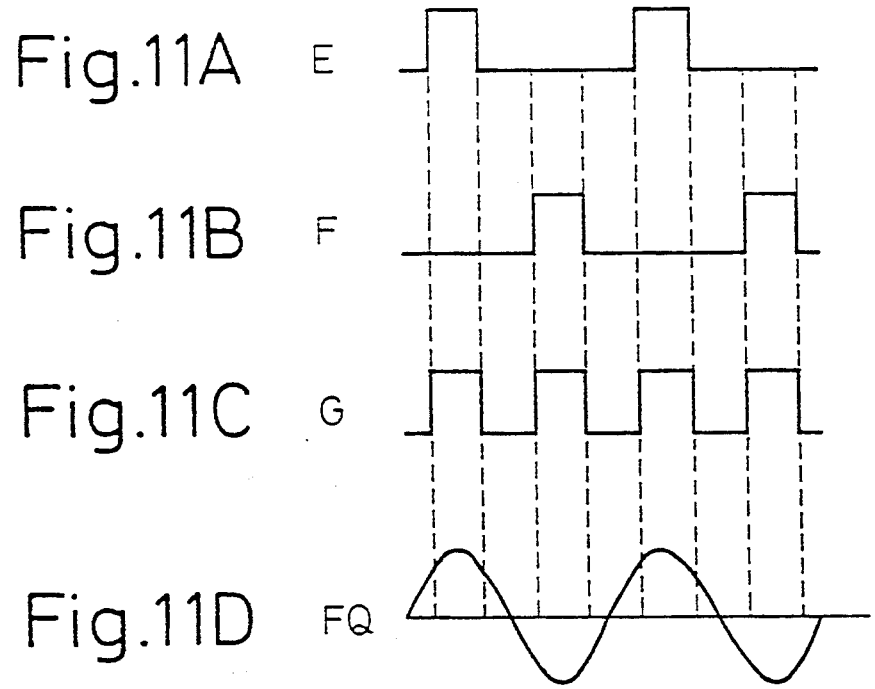
FIGS. 11A to 11D are waveform diagrams showing operation waveforms of predetermined parts shown in FIG. 10.

The first comparator 41 compares the equalized read signal EQ with the +1 level and generates a rectangular wave similar to that indicated at E in FIG. 11A which will be then supplied to the exclusive OR circuit 44. The second comparator 42 compares the equalized read signal EQ with the −1 level and generates a rectangular wave similar to that indicated at F in FIG. 11B which will be then supplied to the exclusive OR circuit 44. The exclusive OR circuit 44 calculates an exclusive OR of the two signals received therein and generates a rectangular wave, similar to that indicated at G in FIG. 11D which will be supplied to the phase-comparator 22.

Although the equalized read signal EQ of the training signal is a sinusoidal waveform which is ¼ of the frequency of the clock CLK and the outputs of the first and the second comparators 41 and 42 are ¼ of the frequency of the clock CLK, since the exclusive OR of the outputs of the first and the second comparators 41 and 42 is calculated by the exclusive OR circuit 44, the clock signal extracted from the equalized read signal EQ of the training signal after calculation of the exclusive OR is ½ of the frequency of the clock CLK. Hence, in this embodiment, the clock output CLK of the voltage-controlled oscillator 69 which will be described later is frequency divided by 2 by the half frequency divider 23' and given to the phase-comparator 22.

The phase-comparator 22 compares the phase of the rectangular wave which is received from the exclusive OR circuit 44 with the phase of the clock which is created by frequency dividing the output signal of the voltage-controlled oscillator 69 by 2, and outputs the phase difference Un which will be given to two input terminals of the change-over switch 80. In this embodiment, too, the change-over switch 80 connects the loop filter 68 to the phase-comparator 22 during reproduction of the preamble portion of data and connects the loop filter 68 to the partial-response phase-comparator 90 during reproduction of the data portion of the data.

Hence, during reproduction of the preamble portion of data, the phase difference Un between the clock which is generated from the training signal as it is and as it is compared with the envelope and which is synthesized at the exclusive OR circuit 44 and the clock which is created by frequency dividing the output signal of the voltage-controlled oscillator 69 by 2 is sent from the phase-comparator 22 to the loop filter 68 through the change-over switch 80 so that the frequency of the voltage-controlled oscillator 69 is synchronized with the normal frequency which is different from the hangup frequency by the sampling signal. Hence, even when the change-over switch 80 has changed its connection to the partial response phase-comparator 90 and the clock generation system has changed to hangup by means of the sampling signal during reproduction of the data portion that follows, continued normal hangup is assured.

Figure 12:
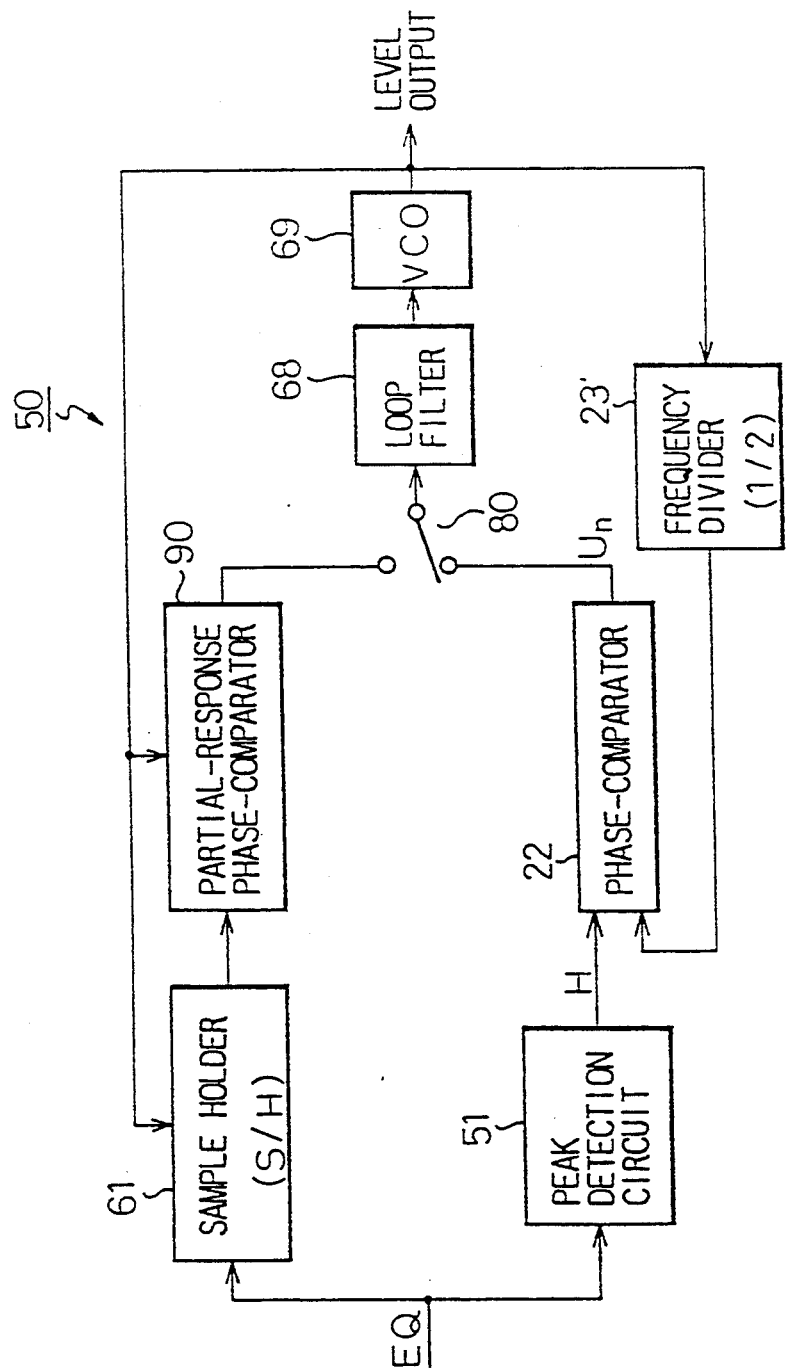
FIG. 12 is a block circuit diagram showing the structure of the clock generator according to the fourth embodiment of the present invention.

FIG. 12 is a block circuit diagram showing a structure of a clock generator 50 of a zone-bit recording type magnetic disk drive according to a fourth embodiment of the present invention. Only difference from the clock generator 20 of the magnetic disk drive according to the first embodiment described with reference to FIG. 5 is that the zero crossing detection circuit 21 is replaced with a peak detection circuit 51. Parts similar to those previously described with reference to FIG. 1 showing the clock generator 20 of the conventional magnetic disk drive of the first embodiment described with reference to FIG. 5 are denoted by the same reference numerals, and similar description will be simply be omitted.

In the fourth embodiment, the partially equalized read signal EQ is also sent to the peak detection circuit 51 which is disposed in parallel to the sample-holder circuit 61. As indicated at H in FIGS. 12 and 13A, the peak detection circuit 51 generates a rectangular wave which rises at positive and negative peaks of the training signal and the rectangular wave is inputted to the phase-comparator 22. The phase-comparator 22 receives at its other input an output of the frequency divider 23'.

In the fourth embodiment as well, the equalized read signal EQ which is generated by partially equalizing the training signal at the partial-response equalizing circuit PE (not shown) has a sinusoidal waveform which is ¼ of the frequency of the clock CLK as shown in FIGS. 6A, 6B, 7A, 7B, and 7C. On the other hand, the sampling signal Yn which is created by the sample-holder circuit 61 has a rectangular waveform. The equalized read signal EQ of the training signal is a sinusoidal waveform which is ¼ of the frequency of the clock CLK, while the rectangular wave which rises at the positive and the negative peaks of the training signal is ½ of the frequency of the clock CLK. Hence, in this embodiment, the clock output CLK of the voltage-controlled oscillator 69 which will be described later is frequency divided by 2 by the half frequency divider 23' and sent to the phase-comparator 22. The phase-comparator 22 compares the phase of the rectangular wave which is received from the peak detection circuit 51 with the phase of the clock which is created by frequency dividing the output signal of the voltage-controlled oscillator 69 by 2, and outputs the phase difference Un.

The phase difference Zn from the partial-response phase-comparator 90 and the phase difference Un from the phase-comparator 22 are respectively given to two input terminals of the change-over switch 80 in such a manner that either one output will be received by the loop filter 68. In this embodiment, the change-over switch 80 connects the loop filter 68 to the phase-comparator 22 during reproduction of the preamble portion of data and connects the loop filter 68 to the partial-response phase-comparator 90 during reproduction of the data portion of the data.

Hence, during reproduction of the preamble portion of data, the phase difference Un between the clock which is generated using the peak values of the training signal and the clock which is created by frequency dividing the output signal of the voltage-controlled oscillator 69 by 2 is sent from the phase-comparator 22 to the loop filter 68 through the change-over switch 80 so that the frequency of the voltage-controlled oscillator 69 is synchronized with the normal frequency which is different from the hangup frequency by the sampling signal. Hence, even when the change-over switch 80 has changed its connection to the partial-response phase-comparator 90 and the clock synchronous system has changed to clock recovery by means of the sampling signal during reproduction of the data portion that follows, continued normal recovery is assured.

As heretofore described in the present invention, during reproduction of the preamble portion of data, the frequency of the voltage-controlled oscillator 69 is controlled by the clock which is generated from the read signal which is not sampled during reproduction of the data portion, clock generation is performed using the sampling signal Yn. Hence, there is no possibility that the clock will be hungup.

As described above, according to the present invention, since the clocks generated in a different clock synchronous system during reproduction of the preamble portion of data, hangup would not occur, and therefore, accurate clock reproduction is performed. In addition, since synchronizing with the sampling signal is carried out after hanging up the frequency by means of the continuous signal obtained from the training signal which is written in the preamble portion of the data, the clock is recovered quickly.

What is claimed is:

1. A clock generator for a magnetic disk drive, in which data are recorded by the zone-bit recording method, a read signal is read from a magnetic disk in which a training signal is recorded in a preamble portion of the data and is sampled, after partial equalizing, to thereby generate a sampling read signal from which data and a clock are reproduced, said clock generator comprising:

a sample-holder circuit for generating a sampling signal from a read signal;

a partial-response phase-comparator comprising: a ternary detection circuit for detecting three magnitude values +1, 0 and −1 of said sampling signal to thereby generate a detection signal; first delay means for generating a delayed sampling signal which is delayed in time by 1 symbol from said sampling signal; second delay means for generating a delayed detection signal which is delayed in time by 1 symbol from said detection signal; a first multiplier for multiplying said delayed sampling signal and said detection signal; a second multiplier for multiplying said sampling signal and said delayed detection signal; and a subtracter for calculating the difference between the products which are obtained in said first and said second multipliers and and for detecting a phase difference between a sampling clock timing and a signal point of a read signal waveform;

a loop filter for smoothing the phase difference which is detected;

a voltage-controlled oscillator the frequency of which is controlled by the phase difference which is smoothed;

a frequency divider for frequency dividing a signal from the voltage-controlled oscillator;

a clock extraction circuit for extracting a clock component from said training signal as it is partially equalized;

a phase-comparator for comparing the phase of an output signal of the frequency divider with the phase of an output signal of the clock extraction circuit to thereby obtain a phase difference; and a change-over switch which is disposed between said partial-response phase-comparator, said phase-comparator and said loop filter, said change-over switch connecting said phase-comparator to said loop filter during reproduction of the preamble portion of the data and for connecting said partial-response phase-comparator to said loop filter during reproduction of a data portion of the data.

2. A clock generator for a magnetic disk drive as set forth in claim 1, wherein said clock extraction circuit is a zero-crossing detector which extracts timings at which said training signal crosses a 0 level and said frequency divider is a quarter frequency divider.

3. A clock generator for a magnetic disk drive as set forth in claim 1, wherein said clock extraction circuit is comprised of an absolute value circuit for detecting the absolute value of said training signal, an envelope detection circuit for detecting the amplitude of said training signal and a comparator for comparing output signals of said absolute value circuit and said envelope detection circuit, and said frequency divider (11) is a half frequency divider.

4. A clock generator for a magnetic disk drive as set forth in claim 1, wherein said clock extraction circuit is comprised of an envelope detection circuit for detecting the amplitude of said training signal, a first comparator for comparing a +1 level output signal of the envelope detection circuit with said training signal, a second comparator for comparing a −1 level output signal of the envelope detection circuit with said training signal and an exclusive OR circuit for calculating an exclusive OR of output signals from said first and said second comparators, and said frequency divider is a half frequency divider.

5. A clock generator for a magnetic disk drive as set forth in claim 1, wherein said clock extraction circuit is a peak detector for detecting peaks of said training signal and said frequency divider (11) is a half frequency divider.

* * * * *